United States Patent [19]
Chen et al.

[11] Patent Number: 5,674,777
[45] Date of Patent: Oct. 7, 1997

[54] METHOD FOR FORMING SILICON-BORON BINARY COMPOUND LAYER AS BORON DIFFUSION SOURCE IN SILICON ELECTRONIC DEVICE

[75] Inventors: Tung-Po Chen, Taichung; Tan-Fu Lei; Chun-Yen Chang, both of Hsin-Chu, all of Taiwan

[73] Assignee: National Science Council, Taipei, Taiwan

[21] Appl. No.: 572,495

[22] Filed: Dec. 14, 1995

Related U.S. Application Data

[63] Continuation-in-part of Ser. No. 324,726, Oct. 18, 1994, abandoned.

[51] Int. Cl.[6] .................................................. H01L 21/20
[52] U.S. Cl. .................. 437/101; 437/141; 437/160; 437/950; 148/DIG. 1; 148/DIG. 34; 148/DIG. 61; 148/DIG. 144; 148/DIG. 152
[58] Field of Search ............................. 437/160, 141, 437/101, 950; 148/DIG. 1, DIG. 34, DIG. 61, DIG. 144, DIG. 152

[56] References Cited

U.S. PATENT DOCUMENTS

| | | |
|---|---|---|
| 4,698,104 | 10/1987 | Barker et al. |
| 5,122,482 | 6/1992 | Hayashi et al. ............ 437/225 |
| 5,171,708 | 12/1992 | Katayama et al. .......... 437/160 |
| 5,208,185 | 5/1993 | Mori et al. ............ 148/DIG. 34 |
| 5,227,329 | 7/1993 | Kobayashi et al. |
| 5,298,452 | 3/1994 | Meyerson . |
| 5,366,926 | 11/1994 | Mei et al. ................... 437/173 |
| 5,389,570 | 2/1995 | Shiozawa ................... 437/101 |
| 5,393,682 | 2/1995 | Liu ............................ 437/41 |

*Primary Examiner*—John Niebling
*Assistant Examiner*—Long Pham
*Attorney, Agent, or Firm*—Knobbe, Martens, Olson & Bear, LLP

[57] ABSTRACT

The present invention is related to a method for fabricating a silicon electronic device having a boron diffusion source layer, includes steps of: a) providing a silicon substrate; b) depositing a silicon layer on said silicon substrate; and c) growing a silicon-boron binary compound layer on said silicon layer as said boron diffusion source. When the Si-B layer is formed by a UHV/CVD process according to the present invention, the boron concentration in the Si-B binary compound layer will be extraordinary high (up to $1 \times 10^{21}$ to $5 \times 10^{22}$ atoms/cm$^3$).

17 Claims, 4 Drawing Sheets

METHOD FOR FORMING SILICON-BORON BINARY COMPOUND LAYER AS BORON DIFFUSION SOURCE IN SILICON ELECTRONIC DEVICE

FIELD OF THE INVENTION

The present invention is a continuation-in-part application of the U.S. patent Ser. No. 08/324,726 filed on Oct. 18, 1994, now abandoned which is related to a boron diffusion source in a silicon electronic device, and more particularly, the boron diffusion source is a Si-B binary compound layer.

BACKGROUND OF THE INVENTION

In order to obtain high performance electronic devices, a heavily doped poly-Si film is usually used as a diffusion source to fabricate the elevated source/drains of CMOS devices and poly-Si emitter bipolar transistors. The advantages of using a heavily doped poly-Si film as a diffusion source are increased packing density and switching speed, and elimination of aluminum spiking through p-n shallow junctions.

Poly-Si contacted $p^+$-n shallow junctions can be fabricated with several techniques.

1) A $p^+$ poly-Si film is doped by $BF_2^+$ implantation, and then the boron atoms in the $p^+$ poly-Si film diffuse into the Si substrate below the poly-Si film to form $p^+$-n shallow junctions. In this process, however, the emitter-base junction depth is sensitive to the thermal budget due to the rapid diffusion of boron atoms. In addition, a lower implantation dose at the poly-Si contacted window sidewall and the shadowing effect may lead to a non-uniform junction. The effects are more pronounced for-as-deposited poly-Si with an anisotropic structure. It is also found that the incorporation of fluorine atoms in the poly-Si film during $BF_2^+$ implantation has effects on the acceleration of the break-up of the poly-Si/Si interfacial oxide and the formation of fluorine bubbles at the poly-Si/Si interface. The break-up of the interfacial oxide will fail to improve the dc current gain of the bipolar transistor. Moreover, it is found that two groups of fluorine bubbles are distributed in the as-implanted fluorine peak region and at the original poly-Si/Si interface, respectively. The shape, the size and the density of bubbles at the original poly-Si/Si interface are related to annealing temperature and time. The presence of fluorine bubbles at the poly-Si/Si interface will affect the transport of majority and minority carriers inn the emitter region.

2) A boron implanted poly-Si layer can also be used as a diffusion source in the poly-Si/Si system. The boron profile and the junction depth are dependent on the dopant dose. Unfortunately, the boron concentration obtained by this method is usually not high enough, and a period of undesirably long implantation time will be required to obtain a high dopant dose.

3) Another useful diffusion source is an in-sire boron doped poly-Si layer. The junction depth and the morphology of the poly-Si/Si interface are also related to boron concentration.

As devices are scaled down, it is necessary to scale the vertical doping profile and base width down. A new process that forms a very shallow and uniform junction is required.

SUMMARY OF THE INVENTION

An object of the present invention is to provide a Si-B binary compound layer as a boron diffusion source in a silicon electronic device, which facilitates the formation of a very shallow and uniform junction.

Another object of the present invention is to provide a Si-B binary compound layer as a boron diffusion source in a silicon electronic device, which can almost be regarded as an infinite diffusion source of boron atoms.

A further object of the present invention is to provide a Si-B binary compound layer as a boron diffusion source in a silicon electronic device, which can be formed at a temperature as low as 550° C.

In accordance with the present invention, a method for fabricating a silicon electronic device having a boron diffusion source layer, includes steps of: a) providing a silicon substrate; b) depositing a silicon layer on said silicon substrate; and c) growing a silicon-boron binary compound layer on said silicon layer as said boron diffusion source. The silicon substrate can be an amorphous silicon substrate, and the silicon layer can be a recrystallized amorphous silicon layer.

In step b), two further steps b') and b") are included: b') depositing an amorphous silicon layer on said silicon substrate by using $SiH_4$ gas in a low pressure CVD system at about 550° C.; and b") applying a temperature of about 800° C. to said amorphous silicon layer under $N_2$ atmosphere to recrystallize said amorphous silicon layer into said recrystallized amorphous silicon layer.

The step c) is executed by using a mixture of pure $SiH_4$ and $B_2H_6$ gases (1% in $H_2$). A molar ratio of $SiH_4/B_2H_6$ in said mixture is preferably about ⅕. In this case, the step c) is executed in a Ultrahigh Vacuum Chemical Vapor Deposition (UHV/CVD) system, preferably at a temperature of about 550° C.

In accordance with another aspect of the present invention, the method preferably further includes steps of: d) annealing the resulting device at a temperature ranged between 800° and 1150° C. in an $N_2$ atmosphere.

The silicon electronic device according to the present invention can be a CMOS device or a p-n-p poly-Si emitter bipolar transistor.

The present invention may be best understood through the following description with reference to the accompanying drawings, in which:

DETAILED DESCRIPTION OF THE PREFERRED EMBODIMENT

Figure 1:
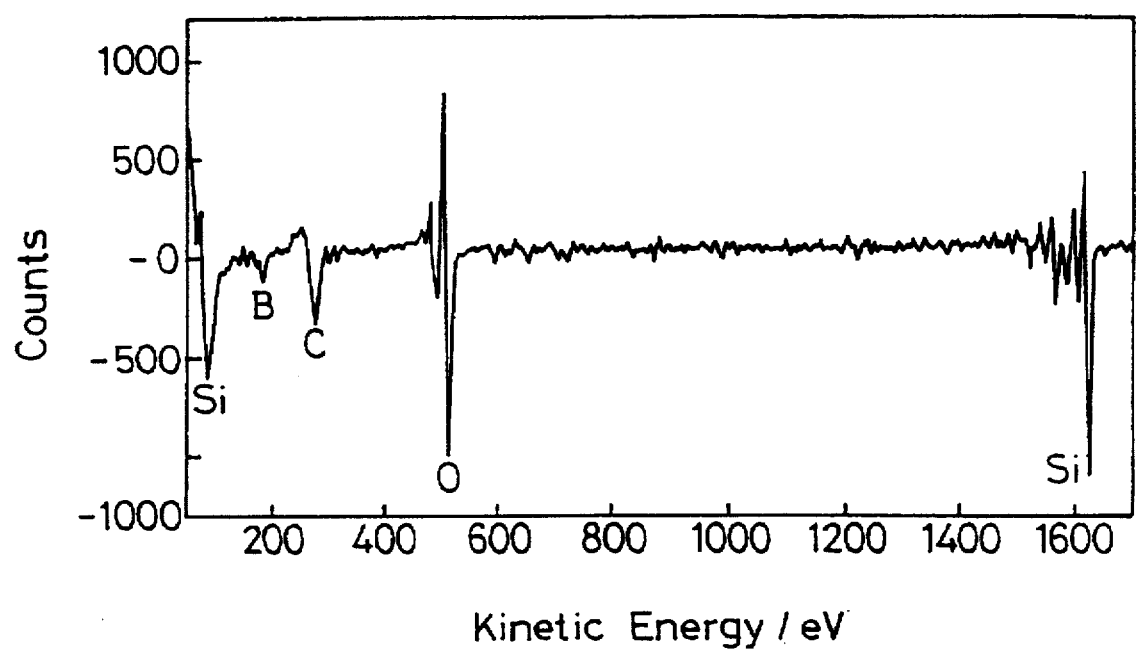
FIG. 1 is an AES spectrum of a Si-B binary compound layer deposited in a UHV/CVD system according to the present invention.

As described in the background of the invention, the use of the poly-Si film doped by $BF_2^+$ implantation, the boron doped Si layer, or the in-situ boron doped poly-Si layer as a boron diffusion source cannot achieve the purpose of a very shallow and uniform junction. Therefore, a new material, Si-B binary compound, as a boron diffusion source is proposed in the present invention to resolve the problem.

Physically, the low solid solubility generally limits the concentration of boron atoms that can be incorporated into the silicon lattice. The Si-B binary compound can be formed when the boron concentration markedly exceeds the solid solubility limit. For example, a thin boron-rich layer was found to be present at the $B_2O_3$/Si interface during a high temperature drive-in process. Although the phase and the physical properties of Si-B compound are not clearly understood, the boron-rich layer is expected to be an approximately infinite diffusion source.

According to the present invention, a method for fabricating a silicon electronic device having a boron diffusion source layer is provided. The method includes steps of: a) providing a silicon substrate; b) depositing a silicon layer on the silicon substrate; and c) growing a silicon-boron binary compound layer on the silicon layer as the boron diffusion source.

The present invention will now be described more specifically with reference to the following embodiments. It is to be noted that the following descriptions of preferred embodiments of this invention are presented herein for purpose of illustration and description only; it is not intended to be exhaustive or to be limited to the precise form disclosed.

The substrates used in this example are n-type (100) Si wafers with a resistivity of 4–7 Ω-cm. Prior to the deposition of an amorphous silicon film, the wafers are dipped in a dilute HF solution to remove the native oxide and followed by a deionized water rinse. Then, the amorphous silicon films is deposited in a low pressure CVD (LPCVD) system at 550° C. using $SiH_4$. The deposition pressure and deposition rate are about 20 Pa and 2 nm/min, respectively. After deposition, the amorphous silicon was recrystallized into poly-Si at 800° C. in $N_2$ ambient. Prior to the deposition of a UHV/CVD film, the wafers are loaded into the loading chamber of the UHV/CVD system after a dilute HF solution dip, and then transferred into the reaction chamber. The wafers are not rinsed in water after the dilute HF dip. The UHV/CVD system is an isothermal hot-wall system that consists of a reaction chamber and a loading chamber. The base pressure of the reaction chamber is $2\times10^{-8}$ torr. Following a 20-nm-thick undoped poly-Si deposition, a Si-B binary compound layer with a thickness of 180 nm is grown by using a mixture of pure $SiH_4$ and $B_2H_6$ (1% in $H_2$) at 550° C. The gas pressures of $SiH_4$ and $B_2H_6$ are 1 and 0.2 Pa, respectively. After the deposition of the Si-B binary compound layer, some of the wafers are capped with a 300-nm-thick plasma-enhanced CVD (PECVD) oxide and annealed in an $N_2$ ambient at a temperature ranging from 800° to 1150° C.

Figure 2:
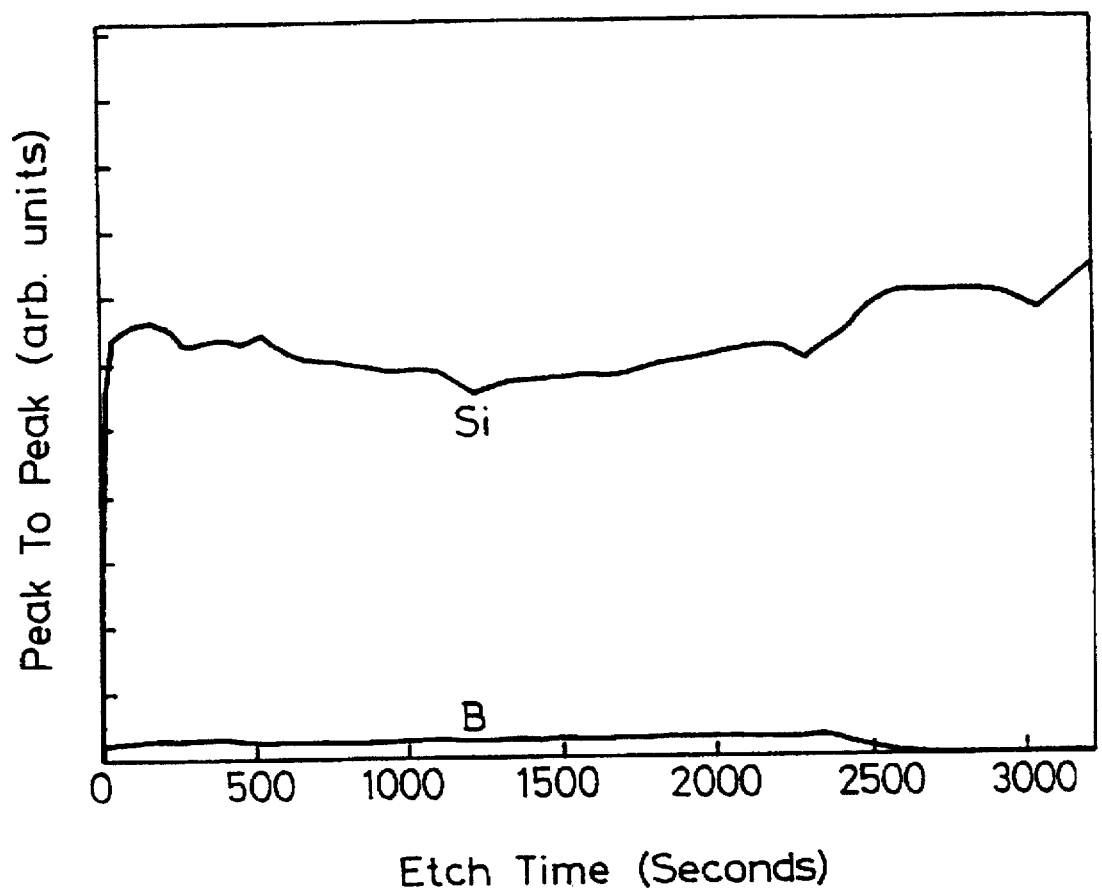
FIG. 2 shows an AES depth profile of an as-deposited Si-B film according to the present invention.

The analysis of boron and oxygen distribution profile of the Si-B binary compound layer grown in a UHV/CVD system at 550° C. is carried out with a CAMECA IMS-4f ion microanalyzer and Auger electron spectroscopy (AES), and the AES spectrum of the Si-B binary compound layer is shown in FIG. 1. One of the Auger peaks in the spectrum near 200 eV is attributed to the KLL Auger transitions of boron. Carbon and oxygen peaks are also clearly visible in the near surface layer. FIG. 2 shows the AES depth profile of an as-deposited Si-B film. It can be seen that the boron concentration is well above the detection limit.

Figure 3:
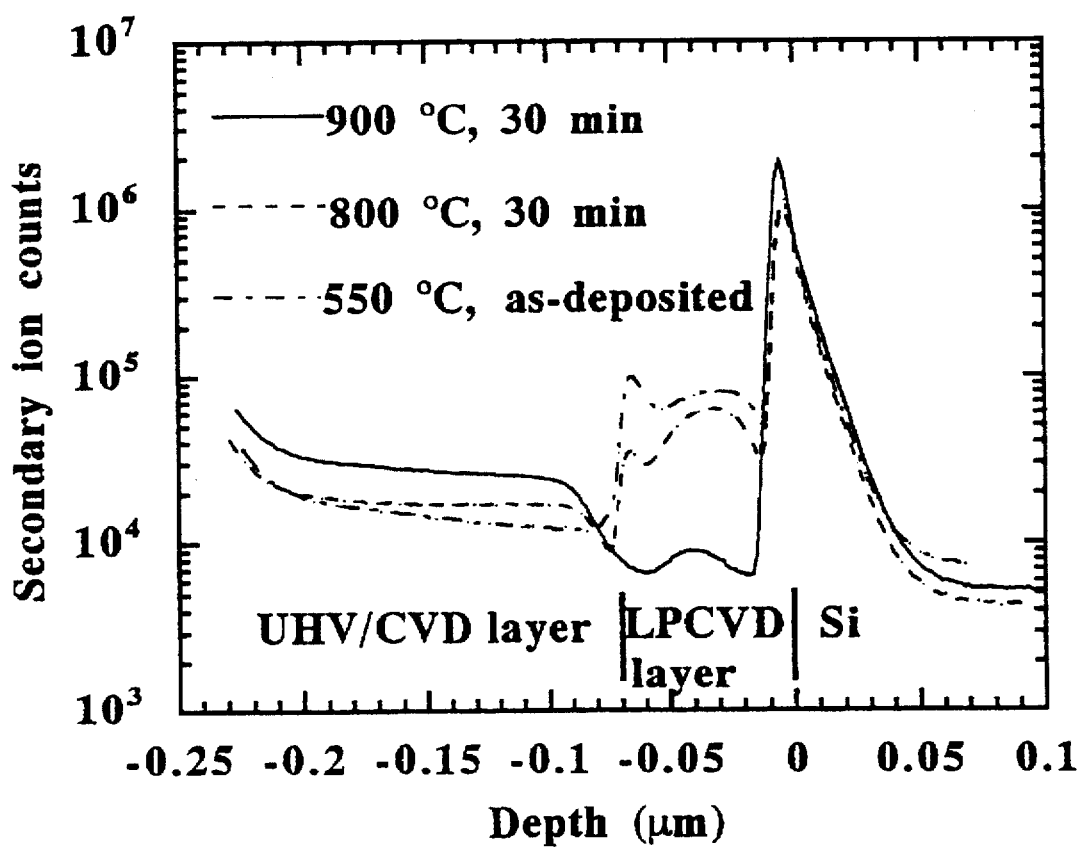
FIG. 3 shows the SIMS oxygen depth profiles for layers of an as-deposited silicon electronic device and a silicon electronic device processed by thermal annealing in an $N_2$ ambient at 800° and 900° C. for 30 minutes, respectively.

FIG. 3 shows the SIMS oxygen depth profiles for layers of an as-deposited silicon electronic device and a silicon electronic device processed by thermal annealing in an $N_2$ ambient at 800° and 900° C. for 30 minutes, respectively. The analysis of oxygen distribution profiles are carded out using $C_s^+$ primary ion bombardment. A sharp oxygen peak is found to be present at the LPCVD layer/Si substrate interface. The oxygen peak is attributed to the presence of an interfacial native oxide, which is formed during the LPCVD process. In contrast, a very small oxygen peak is present at the UHV/CVD layer/LPCVD layer interface. This implies that the interface of UHV/CVD layer/LPCVD layer is relatively clean. Moreover, the oxygen profile in the as-deposited films reveals that the secondary ion counts of oxygen in the UHV/CVD layer is much lower than that in the LPCVD layer. This is apparently due to lower background partial pressure of oxygen in the UHV/CVD system than that in the LPCVD system. The partial pressure of $O_2$ and $H_2O$ in the UHV/CVD system is less than $10^{-9}$ and $5\times10^{-9}$ torr, respectively, as investigated with the Residual Gas Analyzer (RGA). After annealing at 800° C., it can be seen that some of oxygen atoms diffused from the LPCVD layer into the Si-B binary compound layer. The secondary ion counts of oxygen in the Si-B layer is slightly higher than that of as-deposited films. For the sample annealed at 900° C., the secondary ion counts of oxygen in the Si-B layer become obviously higher than that in the LPCVD layer. As known to those skilled in the art, boron defect complexes can act as effective traps for oxygen atoms. Therefore, the drive-in of oxygen may be caused by an interaction between boron and oxygen. The results suggest that the Si-B layer deposition on poly-Si films can act as a sink for oxygen atoms during the thermal annealing process. It is also known that the incorporation of oxygen atom in the poly-Si films can inhibit secondary grain growth during subsequent high temperature annealing and increase sheet resistance by reducing both Hall mobility and carrier concentration. On the other hand, by using Si-B layer as a diffusion source, a larger poly-Si grain size can be obtained. It is attributed to the effects of the gathering of oxygen impurity by the Si-B layer and the secondary grain growth during the oxidation of the Si-B layer. In brief, the quality of the poly-Si films can be improved by using a Si-B layer as the diffusion source.

Figure 4:
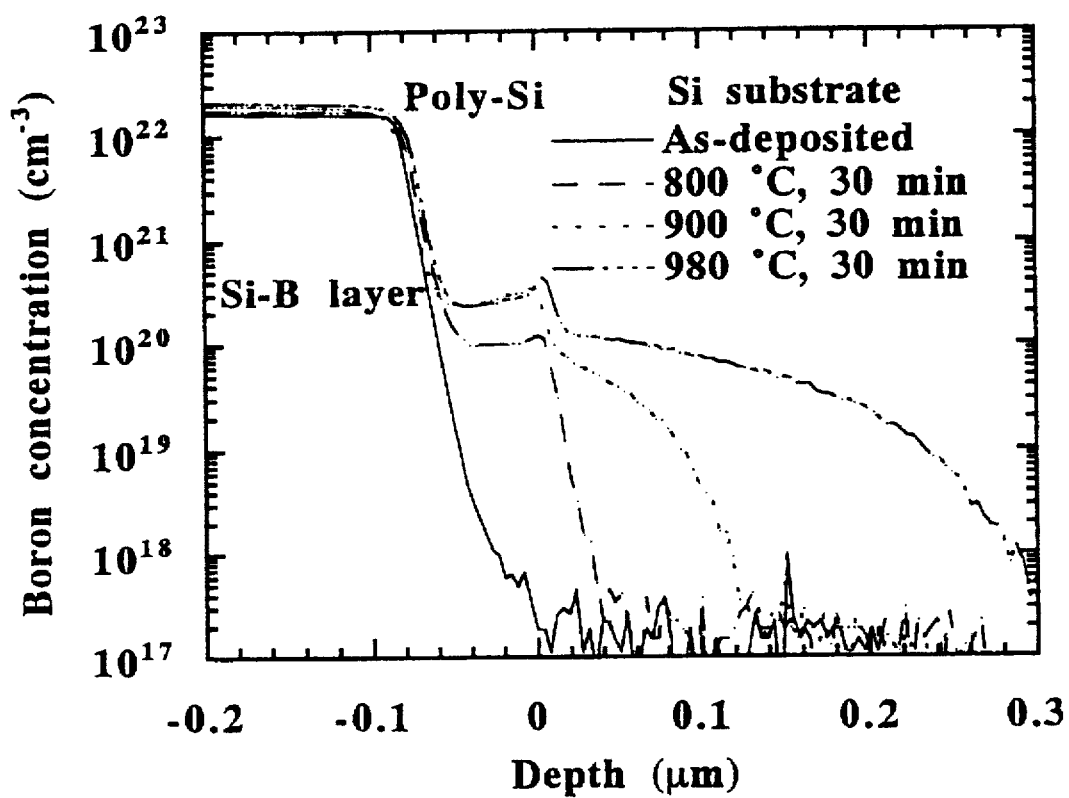
FIG. 4 shows the boron depth profiles for layers of an as-deposited silicon electronic device and a silicon electronic device processed by thermal annealing in an $N_2$ ambient at 800°, 900° and 980° C. for 30 minutes, respectively.

FIG. 4 shows the boron depth profiles for layers of an as-deposited silicon electronic device and a silicon electronic device processed by thermal annealing in an $N_2$ ambient at 800°, 900° and 980° C. for 30 minutes, respectively. It can be seen that some of boron atoms diffused from the Si-B layer into the polycrystalline silicon and single-crystal silicon, and a shallow junction is formed after a thermal annealing process. However, most atoms in the Si-B layer are immobile during the thermal annealing process. It is known that the boron diffusivity is strongly reduced in single crystal silicon and poly-Si where the boron concentration exceeds the solid solubility limit. Formation of precipitates which reduces the boron diffusivity is suggested. However, an identification of the nature of the precipitates has not been done yet. According to the results revealed by the transmission electron diffraction patterns, the phase of $SiB_6$ is found to be present in the Si-B layer even after a thermal annealing process. These results suggests that the presence of $SiB_6$ in the Si-B layer may lead to the reduction of boron diffusivity in the layer during the thermal annealing process.

In summary, the use of a Si-B layer grown on the amorphous silicon as a diffusion source is disclosed in the present invention. Preferably, the growth of the Si-B layer is performed in an Ultrahigh Vacuum Chemical Vapor Deposition (UHV/CVD) system using pure $SiH_4$ and $B_2H_6$ (1% in $H_2$) at a temperature as low as 550° C. The Auger electron spectroscopy and secondary ion mass spectroscopy show that the boron concentration is extraordinary high (up to $1 \times 10^{21}$ to $5 \times 10^{22}$ atoms/cm$^3$). From the analysis of transmission electron diffraction patterns, the phase of silicon hexaboride (SiB$_6$) is found to be present in as-deposited Si-B layer and the films after annealing. After thermal annealing, most of the boron atoms in the Si-B layer is immobile. The precipitation of SiB6 in the Si-B layer may lead to the limitation of grain grog of polycrystalline Si-B films, the reduction of boron diffusivity in the layer during thermal annealing and the increase in resistivity of the Si-B layer. The electrical behaviors of Si-B layer are different from the heavily doped poly-Si. In addition, most of oxygen impurity atoms in the poly-Si films diffuse into the Si-B layer after thermal annealing.

While the invention has been described in terms of what are presently considered to be the most practical and preferred embodiments, it is to be understood that the invention need not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A method for fabricating a silicon electronic device having a boron diffusion source layer, comprising the steps of:
   a) providing a silicon substrate;
   b) depositing an amorphous silicon layer on said silicon substrate by using SiH$_4$ gas in a low pressure CVD system at about 550° C.;
   c) applying a temperature of about 800° C. to said amorphous silicon layer under N$_2$ atmosphere to recrystallize said amorphous silicon layer into a recrystallized amorphous silicon layer; and
   d) growing a silicon-boron binary compound layer on said silicon layer as said boron diffusion source.

2. The method according to claim 1 wherein said step d) is executed by using a mixture of pure SiH$_4$ and B$_2$H$_6$ gases (1% in H$_2$).

3. The method according to claim 2 wherein a molar ratio of SiH$_4$/B$_2$H$_6$ in said mixture is greater than about ½.

4. The method according to claim 3, wherein said step d) is executed in a Ultrahigh Vacuum Chemical Vapor Deposition (UHV/CVD) system.

5. The method according to claim 4 wherein said step d) is executed at a temperature of about 550° C.

6. The method according to claim 1 further comprising the step of:
   e) annealing the resulting device at a temperature of between 800° C. and 1150° C. in an N$_2$ atmosphere.

7. The method according to claim 1 wherein said silicon electronic device is a CMOS device.

8. The method according to claim 1 wherein said silicon electronic device is a p-n-p poly-Si emitter bipolar transistor.

9. A method for fabricating a silicon electronic device having a boron diffusion source layer, comprising the steps of:
   a) providing a silicon substrate;
   b) depositing a silicon layer on said silicon substrate; and
   c) growing a silicon-boron binary compound layer on said silicon layer as said boron diffusion source using a mixture of pure SiH$_4$ and B$_2$H$_6$ gases (1% in H$_2$).

10. The method according to claim 9 wherein a molar ration of SiH$_4$/B$_2$H$_6$ in said mixture is greater than about ½.

11. The method according to claim 10 wherein said step c) is executed in a Ultrahigh Vacuum Chemical Vapor Deposition (UHV/CVD) system.

12. The method according to claim 11 wherein said step c) is executed at a temperature of about 550° C.

13. The method according to claim 9 further comprising the step of:
   d) annealing the resulting device at a temperature between 800° C. and 1150° C. in an N$_2$ atmosphere.

14. The method according to claim 9 wherein said silicon electric device is a CMOS device.

15. The method according to claim 9 wherein said silicon electric device is a p-n-p poly-Si emitter bipolar transistor.

16. A method for fabricating a silicon electronic device having a boron diffusion source layer, comprising the steps of:
   a) providing a silicon substrate;
   b) depositing a silicon layer on said silicon substrate by using SiH$_4$ gas in a low pressure CVD system at about 550° C.;
   c) applying a temperature of about 800° C. to said silicon layer under N$_2$ atmosphere to recrystallize said silicon layer into a recrystallized silicon layer; and
   d) growing a silicon-boron binary compound layer on said silicon layer as said boron diffusion source.

17. The method according to claim 16 further comprising the step of:
   d) annealing the resulting device at a temperature between 800° C. and 1150° C. in an N$_2$ atmosphere.

* * * * *